US 6,775,152 B2

(12) United States Patent
Köhler et al.

(10) Patent No.: US 6,775,152 B2
(45) Date of Patent: Aug. 10, 2004

(54) APPARATUS FOR FIXING A SLOT ANGLE

(75) Inventors: Friedrich Köhler, Meitingen (DE); Werner Weishaupt, Horgau (DE)

(73) Assignee: Fujitsu Siemens Computers GmbH, Münich (DE)

( * ) Notice: Subject to any disclaimer, the term of this patent is extended or adjusted under 35 U.S.C. 154(b) by 0 days.

(21) Appl. No.: 10/013,480

(22) Filed: Dec. 13, 2001

(65) Prior Publication Data

US 2002/0122293 A1 Sep. 5, 2002

(30) Foreign Application Priority Data

Dec. 21, 2000 (DE) .......................................... 100 64 115

(51) Int. Cl.⁷ .............................. H05K 7/14; H05K 7/18
(52) U.S. Cl. ....................... 361/801; 361/732; 361/740; 361/747; 361/759; 361/686; 361/752; 361/796
(58) Field of Search .................................. 361/801, 726, 361/732, 740, 747, 759, 802, 741, 756, 737, 685, 816, 818, 800, 799, 753; 312/223.1, 223.2; 211/41.17, 26.2; 174/35 R, 35 GC, 51; 439/92, 98, 100, 106

(56) References Cited

U.S. PATENT DOCUMENTS

| 5,694,291 | A | * | 12/1997 | Feightner | 361/683 |
| 6,220,887 | B1 | * | 4/2001 | Downs | 439/377 |
| 6,231,139 | B1 | * | 5/2001 | Chen | 312/223.2 |
| 6,349,039 | B1 | * | 2/2002 | Boe | 361/801 |
| 6,403,880 | B1 | * | 6/2002 | Elford et al. | 174/51 |
| 6,657,867 | B2 | * | 12/2003 | Smith | 361/725 |

FOREIGN PATENT DOCUMENTS

| DE | 295 20 867 | 4/1996 |
| DE | 296 09 635 | 10/1996 |
| DE | 195 33 063 | 2/1997 |
| DE | 196 06 797 | 8/1997 |
| WO | WO 97/34216 | 9/1997 |

* cited by examiner

Primary Examiner—Phuong T. Vu
(74) Attorney, Agent, or Firm—Cohen, Pontani, Lieberman & Pavane

(57) ABSTRACT

The invention relates to an apparatus for fixing a slot angle (5) to the slot field (2) of a computer housing (1). According to the invention, the slot field (2) is adjusted to the geometry of the slot angle, which means that by closing a cover (9) of the computer housing (1) the slot angles (5) are automatically fixed by way of clamping action.

15 Claims, 1 Drawing Sheet

APPARATUS FOR FIXING A SLOT ANGLE

Figure 1:
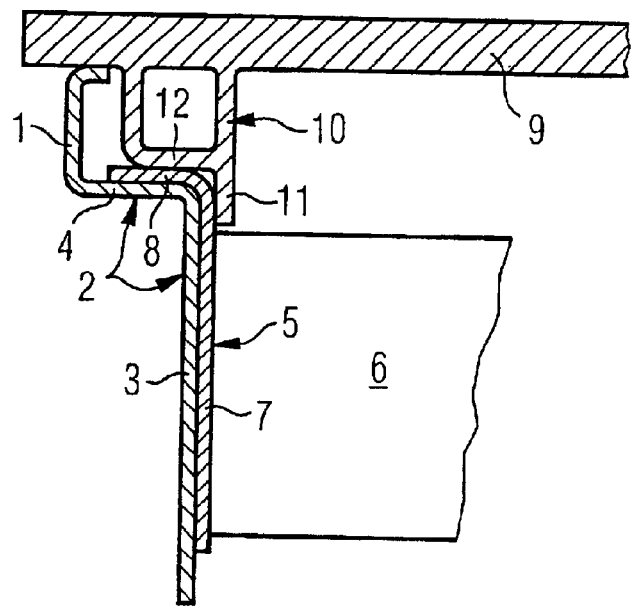

The invention relates to an apparatus for fixing a slot angle to two sections on the slot field of a computer housing, which are essentially perpendicular in relation to each other.

To date, the attachment of slot angles or slot cards in the PC housing has been effected by means of screws or accessories that produce a clamping effect. Clamping accessories of this kind are disclosed, for example, in WO 97/34216, in DE 195 33 063 C1, in DE 295 20 867 U1 and DE 296 09 635 U1 as well as in DE 196 06 797 C2.

The accessories for fixing the slot angle or slot cards in place have the advantage, in contrast to screws, that they are made of plastic and, thereby, preclude the danger of any short circuiting as it exists when screws are dropped during the assembly.

But as before, separate accessories, which must be adapted to the respective PC housing, are still required for mounting the slot angles or slot cards.

Therefore, it is the subject-matter of the present invention to propose a solution that avoids the use of separate accessories.

According to the invention, this objective is achieved by adjusting the slot field to the geometry of the slot angle, causing both sections of the slot angle to come to lie on the slot field from the inside; and the computer housing has a cover that is realized in such a way that it fixes, in its closed state, at least one section of the slot angle in place, in particular by way of clamping.

The great advantage of this solution consists in the fact that, following the opening of the cover, no further mounting steps are necessary in order to exchange the slot angles or slot cards. Also, after the cover is closed again, all slot angles or slot cards are automatically fixed in place again.

According to a preferred embodiment, a fastening part is integrated in or attached to the cover that is used to effect the clamping on the slot angles.

To achieve ideal clamping action, this fastening part is realized, preferably, as slightly elastic. The elasticity also allows for greater measuring tolerances during manufacturing.

According to another preferred embodiment, the fastening part grips around the slot angle in the fixed condition at the angle of the sections that are perpendicular in relation to each other.

Other advantageous realizations of the invention are disclosed in the sub-claims.

Subsequently, the invention will be described in more detail in reference to the embodiment that is shown in the drawings.

Figure 2:
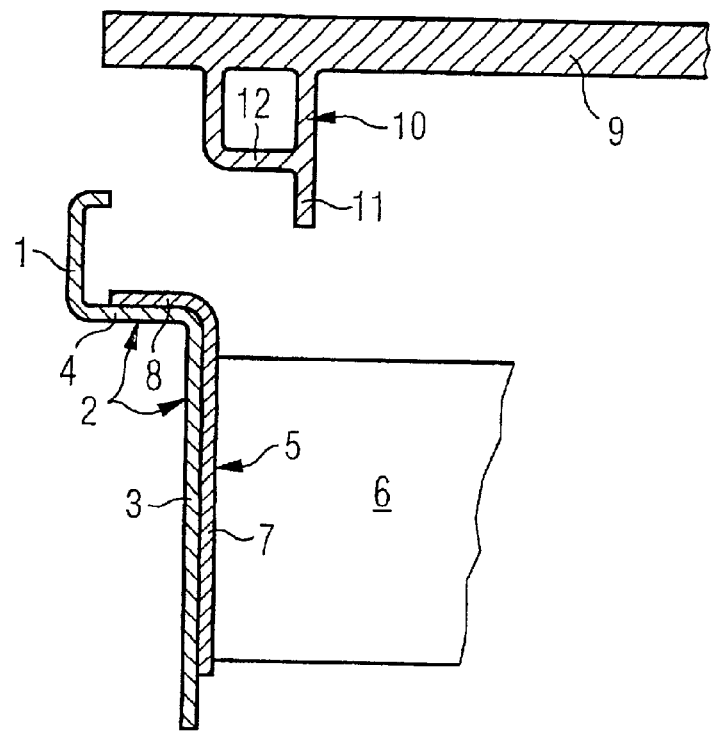

The figures show in:

FIG. 1 a section of an area of a computer housing, including slot field and inserted slot cards, with closed cover and in FIG. 2 the view according to FIG. 1 with an open cover.

FIG. 1 shows a cross section of the part of a computer housing 1 in the area of the slot field 2. In the described embodiment, the slot field 2 is integrated into the wall of the computer housing 1.

The slot field 2 consists of two sections 3 and 4 that are essentially perpendicular in relation to each other. Applied to the slot field 2 from the inside is a slot angle 5, which is connected to a slot card 6 in the shown embodiment.

The slot angle 5 also has two sections 7 and 8 that are perpendicular in relation to each other, resting from the inside on the corresponding sections 3 and 4 of the slot field 2. In terms of its geometry, the slot field 2 is adapted to the geometry of the slot angles 5, allowing them to be placed flush and in close contact with the inside of the slot field 2.

To fix the slot angles 5 or the slot cards 6 with the corresponding slot angles 5 in place, the computer housing has a cover 9, which, in its closed state, at least partially covers said slot card 6 and presses at least against the section 8 of the slot angle 5, thereby clamping it against the section 4 of the slot field 2.

In the shown embodiment, a fastening part 10 is envisioned on the cover 9, also featuring two sections 11 and 12 that are perpendicular in relation to each other, and which are realized in such a way that they grip, in the closed state of the cover 9, around the slot angle 5 at the angle of the sections 7 and 8; and the section 12 presses against the section 8 of the slot angle, and the section 11 prevents any pulling out of the slot card and, to a certain extent, also presses the section 7 of the slot angle 5 against the section 3 of the slot field 2.

Therefore, when closing the cover 9, all the slot angles 5 or slot cards 6 that are located inside the computer housing are automatically fixed in place. Separate mounting, as in the state of the art, is no longer necessary.

After the cover has been opened, as shown in FIG. 2, all slot angles 5 or all the slot cards 6 can be removed without the need for prior separate disassembly.

| List of Reference Symbols | |
|---|---|
| 1 | Computer housing |
| 2 | Slot field |
| 3 | Section of the slot field |
| 4 | Section of the slot field |
| 5 | Slot angle |
| 6 | Slot card |
| 7 | Section of the slot angle |
| 8 | Section of the slot angle |
| 9 | Cover |
| 10 | Fastening part |
| 11 | Section fastening part |
| 12 | Section fastening part |

What is claimed is:

1. Apparatus for securing a slot angle in position within a computer housing having an interior in which a central processing unit and other computer components are arranged, the computer housing having a primary opening for providing access to the interior, and the computer housing having a slot field and an outer cover for closing the computer housing primary opening, wherein the slot angle includes two sections that are perpendicular to each other, the apparatus comprising:

the slot field having a shape conformed to the slot angle such that the two sections of the slot angle engage the slot field inside the computer housing; and the outer cover of the computer housing having a fastening part facing into the housing and pressing against at least one of the two sections of the slot angle when the outer cover is in position to close the computer housing primary opening so that the slot angle is clamped in position between the fastening part and the slot field wherein no separate fastening accessories are required for securing the angle in the computer housing.

2. Apparatus as claimed in claim 1 wherein the cover, in the position for closing the computer housing, grips behind the two sections of the slot angle.

3. Apparatus as claimed in claim 2 or claim 1 wherein the fastening part is integrated in the cover.

4. Apparatus as claimed in claim 2 or claim 1 wherein the fastening part is connected to the cover.

5. Apparatus as claimed in claim 2 or claim 1 wherein the fastening part is elastic.

6. Apparatus as claimed in claim 2 or claim 1 wherein the cover grips around the slot angle, in its fixed state, at the junction of the two sections of the slot angle.

7. Apparatus as claimed in claim 2 or claim 1 wherein the slot angle is connected to a slot card.

8. Apparatus as claimed in claim 2 or claim 1 wherein the slot field is integrated in the computer housing.

9. Apparatus as claimed in claim 1, wherein the outer cover at least partially overlies a slot card.

10. Apparatus as claimed in claim 1, wherein the slot field has two sections respectively parallel to the two sections of the slot angle.

11. Apparatus as claimed in claim 10, wherein the fastening part has two sections respectively parallel to the two sections of the slot angle.

12. Apparatus as claimed in claim 1, wherein the slot field has two sections that are perpendicular to each other.

13. Apparatus as claimed in claim 1, wherein the fastening part has two sections, respectively parallel to the two sections of the slot angle.

14. Apparatus as claimed in claim 1, wherein the fastening part has two sections that are perpendicular to each other.

15. Apparatus for securing a slot angle in position within a computer housing having an interior in which a central processing unit and other computer components are arranged, the computer housing having a primary opening for providing access to the interior, and the computer housing having a slot field and an outer cover for closing the computer housing primary opening, wherein the slot angle includes two sections that are perpendicular to each other, wherein the slot field has a shape conformed to the slot angle such that the two sections of the slot angle engage the slot field inside the computer housing, the apparatus comprising:

the outer cover of the computer housing having a fastening part facing into the housing and pressing against at least one of the two sections of the slot angle when the outer cover is in position to close the computer housing primary opening so that the slot angle is clamped in position by the fastening part; and wherein the outer cover at least partially overlies a slot card within the computer housing wherein no separate fastening accessories are required for securing the angle in the computer housing.

* * * * *